(12) United States Patent
Wester

(10) Patent No.: US 7,384,665 B2
(45) Date of Patent: Jun. 10, 2008

(54) FORMATION OF PROTECTIVE COATINGS FOR COLOR FILTERS

(75) Inventor: Neil Wester, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1044 days.

(21) Appl. No.: 10/448,507

(22) Filed: May 29, 2003

(65) Prior Publication Data

US 2003/0203529 A1  Oct. 30, 2003

Related U.S. Application Data

(62) Division of application No. 08/986,361, filed on Dec. 8, 1997, now Pat. No. 6,603,510.

(51) Int. Cl.
  *B05D 5/06* (2006.01)
(52) U.S. Cl. ............... 427/162; 427/248.1; 427/255.18; 427/255.23; 427/255.28; 427/255.29; 427/255.37; 427/255.394; 427/294; 427/331; 427/352; 427/402; 427/419.1; 427/419.7
(58) Field of Classification Search ............... 427/74, 427/162
  See application file for complete search history.

(56) References Cited

U.S. PATENT DOCUMENTS

| T958,010 | I4 | 5/1977 | Eichenbaum et al. |
| 4,395,629 | A * | 7/1983 | Sasano et al. ............... 250/226 |
| 4,430,400 | A * | 2/1984 | Nakano et al. ............... 430/7 |
| 4,745,327 | A | 5/1988 | Saeki et al. |
| 4,762,730 | A * | 8/1988 | Enke et al. .................. 427/489 |
| 4,768,291 | A * | 9/1988 | Palmer .......................... 34/443 |
| 4,965,241 | A | 10/1990 | Henzel et al. |
| 4,999,266 | A | 3/1991 | Platzer et al. |
| 5,006,190 | A * | 4/1991 | Earle ........................... 156/247 |
| 5,123,998 | A * | 6/1992 | Kishimura .................... 216/48 |
| 5,140,396 | A * | 8/1992 | Needham et al. ............. 430/7 |
| 5,194,976 | A | 3/1993 | Nakano et al. |
| 5,244,694 | A * | 9/1993 | Ozias ........................ 427/248.1 |
| 5,245,686 | A | 9/1993 | Faris et al. |
| 5,278,009 | A | 1/1994 | Iida et al. |
| 5,356,758 | A | 10/1994 | Orvek |
| 5,387,573 | A | 2/1995 | Oldfield et al. |
| 5,531,881 | A * | 7/1996 | Matsumura et al. ......... 204/507 |
| 5,563,102 | A * | 10/1996 | Michael ........................ 438/614 |
| 5,633,739 | A | 5/1997 | Matsuyama et al. |
| 5,642,176 | A | 6/1997 | Abukawa et al. |
| 5,889,277 | A * | 3/1999 | Hawkins et al. ......... 250/208.1 |
| RE37,033 | E | 1/2001 | Tajima et al. |

FOREIGN PATENT DOCUMENTS

EP  571625 A1  12/1993

\* cited by examiner

*Primary Examiner*—Michael Cleveland
*Assistant Examiner*—Ronald D LaFond
(74) *Attorney, Agent, or Firm*—Blakely, Sokoloff, Taylor & Zafman LLP

(57) ABSTRACT

A structure and method for producing color filters with a protective silation layer is described. In one embodiment, each filter is coated with a silation layer to prevent bleeding of material between closely spaced filters during the fabrication process. In a second embodiment, the silation layer is used to protect an array of filters from physical damage during detaping operations. In a third embodiment, the silation layer is used before fabrication later filters in a color filter array to prevent damage to previous filter layers.

16 Claims, 3 Drawing Sheets

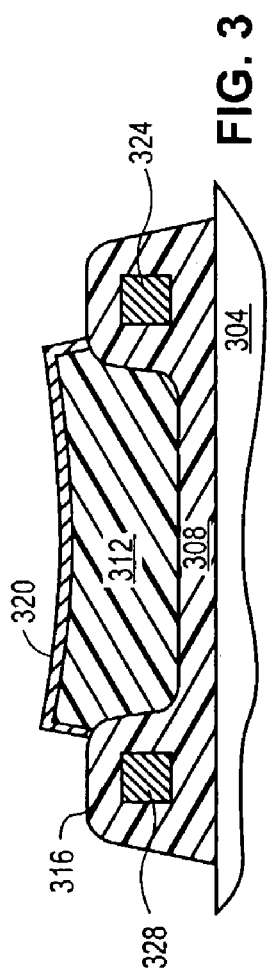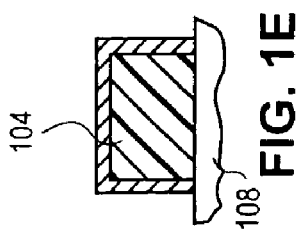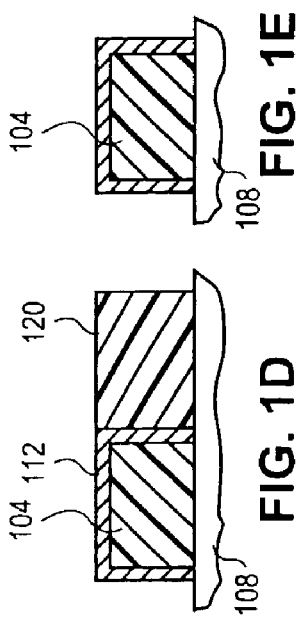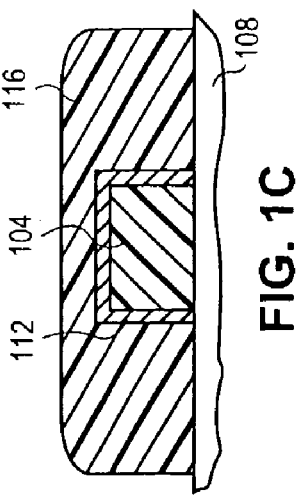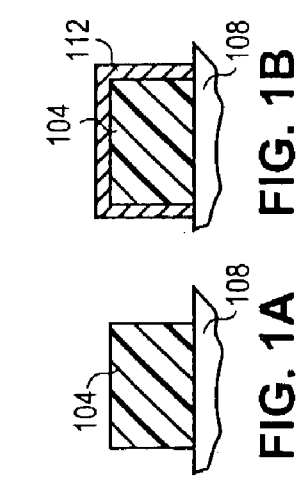

FORMATION OF PROTECTIVE COATINGS FOR COLOR FILTERS

This application is a divisional of U.S. Ser. No. 08/986,361 filed Dec. 8, 1997 now U.S. Pat. 6,603,510.

FIELD OF THE INVENTION

The present invention relates generally to the fabrication of color light detectors. More particularly, the present invention relates to the formation of protective coatings on filters used in color light detectors.

DESCRIPTION OF RELATED ART

Color light detectors are becoming increasingly important in digital imaging applications. Digital imaging systems often use arrays of photo-detectors to generate an image of a subject. In order to generate a color digital image, color filters are fabricated over light sensors such as photo-detectors. Each filter allows only a predetermined color of light to reach a corresponding photo-detector thus determining what color light will be sensed by the photo-detector. By grouping sets of light sensors together, the intensity and color of light reaching an area can be determined.

Each color pixel in a digital image is typically generated by combining the output of a group or set containing several photo-detectors. In one implementation, the output of three corresponding photo-detectors are combined to generate one color pixel. Each corresponding photo-detector is located in close proximity to the other two corresponding photo-detectors. Each corresponding photo-detector has a different color filter filtering received light. In one example, a blue color filter, a red color filter and a green color filter may each be used over a corresponding photo-detector. By determining the intensity of light passing through each color filter, the intensity of light of a particular color or wavelength can be determined. An electronic processor interpolates the data from the three photo-detectors and combines them to determine the color of light received by the photo-detectors in the general region of the pixel. This information is processed electronically and combined with other sets of photo-detectors to generate a digital color image.

Photo-detectors and color filters are typically formed in a complimentary metal oxide semiconductor (CMOS) fabrication process. A number of effects occur during the fabrication process which reduce the filtering capability or damage the color filters. In particular, three problems faced by the fabrication process are described in the following three paragraphs.

A first problem which results from the fabrication of color filters is color bleeding of compounds from adjacent color filters. Color filter arrays which are placed over the photo-detectors or imaging sensors are often generated by depositing pigment dispersed polymer films. The type of pigment determines the filtering capability of the filter. In a typical color detection system, adjacent filters thus have different pigments. The performance of the system is optimized when each photo diode is covered with a single color filter, whether it be red, blue or green. The filter blocks other colors from passing through the filter. Ideally, it is desirable to fabricate filters which transmit one hundred percent of the light at a predetermined frequency range, and completely block light transmission outside of the predetermined range of frequencies. Thus ideally, pigments which determine what color of light will pass through a filter is preferably completely confined to a filter and does not "bleed" into adjacent filters. In practice, the contact between the various different color filters (red, blue, green) results in a slight intermixing of pigments ("bleed") during the fabrication process. The bleed results in a broadening of each individual filter response reducing the color delineation capabilities of each filter. This bleed degrades the overall performance of the system.

A second problem with current fabrication techniques is that during a grinding and gold deposition process (grind/gold process), color filters are often damaged. After the final deposition of CFA (filter) layer materials, wafers or substrates containing the color filters are transferred to a grind/gold process where a protective front side tape is applied to the wafer while the backside of the wafer is thinned and coated with gold. After completion of the grind/gold process, the tape is removed in a detaping operation. Due to the polymeric nature of the filter material (CFA material), the filters are vulnerable to physical damage during the detaping operation. Damage to the color filters jeopardizes the functionality of the fabricated light detector.

A third problem with current methods of fabricating filters in CMOS processes results from repeating processing steps on the entire filter set each time a filter of a different color is added. After generation of a first color filter, each subsequent color in the filter set is produced by a subsequent deposition and photo definition of pigment dispersed in polymer films. Thus a three color set (red, green and blue) of color filters involves three depositions of pigments. Each filter is composed of a CFA layer. Each CFA layer is manufactured from the same starting materials. In the prior art, no physical or chemical resistant barriers are used between the layers. Thus misprocessing or process excursion in the working or processing of a layer may damage previously created filters and require reworking of previously deposited filter layers.

Thus a method of protecting each filter as it is generated is desirable. In particular, the method would preferably utilize a barrier to protect each individual filter in a multi-color filter array such that the barrier would prevent bleeding between adjacent color filters. The barrier would preferably be non polymeric to help prevent damage during the detape process. The procedure would also preferably be performed after each CFA layer is deposited creating a barrier between layers. The barrier allows accidental misprocessing or minor processing variations to occur without damage to previously fabricated layers reducing the probability that a rework of previously deposited layers is necessary. Such a technique for generating a protective barrier is described in the following application.

BRIEF DESCRIPTION OF THE DRAWINGS

FIGS. 1A-1E illustrates a cross-section of a color filter array structure at various stages of the fabrication process.

FIGS. 2A-2E illustrate a cross-section of a color filter array structure at various stages of an alternative fabrication process. The illustrated structure which results uses a silation layer appropriate for protecting against surface damage in a detape process.

FIG. 3 illustrates a cross-section of a device using a color filter.

DETAILED DESCRIPTION OF THE INVENTION

Figure 4A:
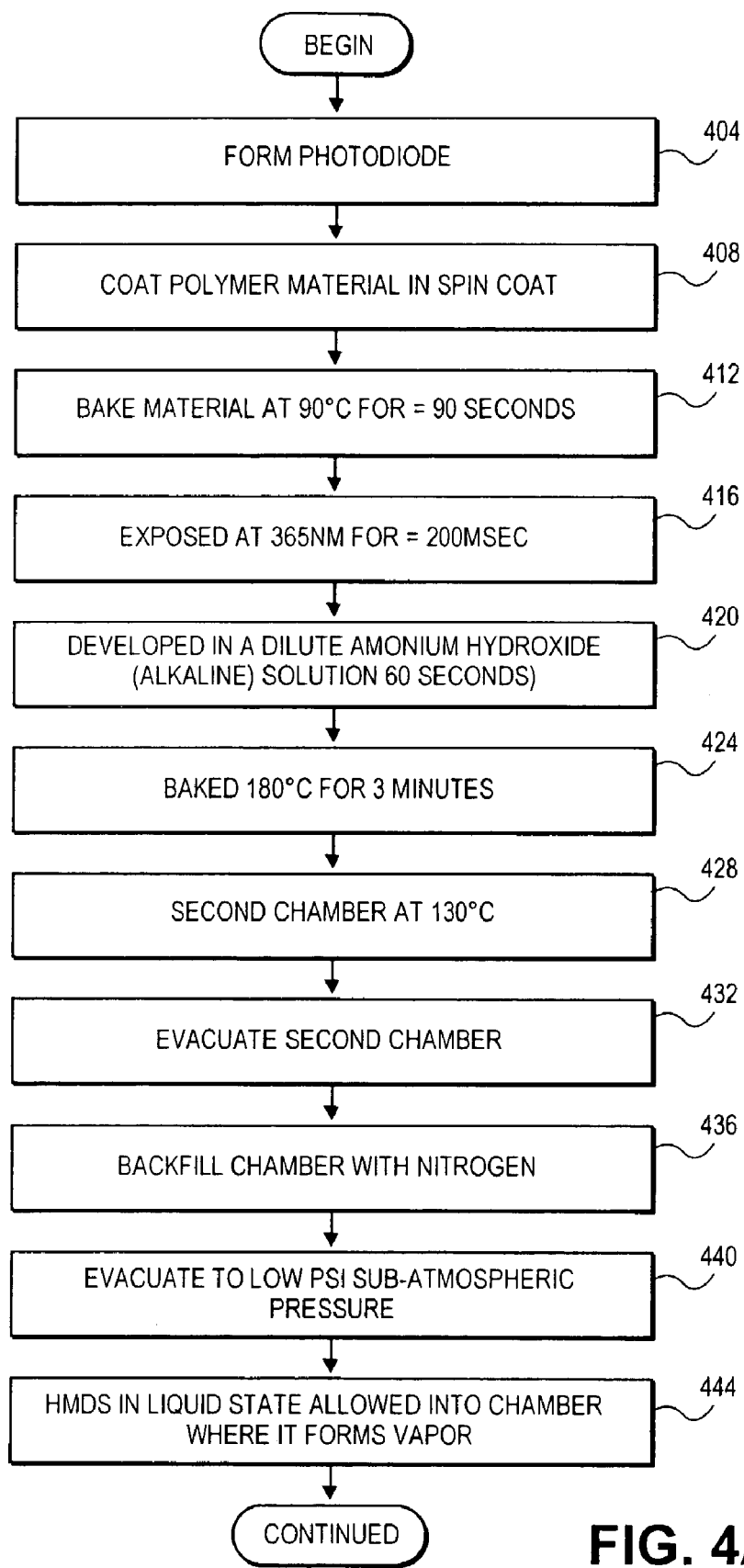
FIGS. 4A and 4B illustrate a flow diagram illustrating the steps used in fabricating color filters and protective layers around color filters.

In the following description, a protective silation layer will be formed over color filters used in semiconductor light sensing devices. The silation layer will protect and reduce the probability of damage to the color filters. For example, by using a silation layer, the detaping processes in grind/gold deposition processes will damage fewer color filters. The formation of a polymer silation layer between CFA layers also reduces the need for reworking of previously deposited layers when a subsequent CFA layer is misprocessed. Finally, the use of the silation layer between adjacent color filters reduces bleeding of pigments or CFA polymer material between adjacent different colored filters. Reducing bleeding improves the color selectivity of each filter.

In the accompanying description, certain details will be provided to facilitate understanding of the invention. For example, the specification will recite processing times as well as processing materials such as hexamethyl di-silizane. However, it is recognized that other silation materials may be used and different processing times may be appropriate. The included details are provided to facilitate understanding of the invention and should not be interpreted to limit the scope of the invention. Certain details, for example, describing the steps used to create a photo-detector will be omitted, because such details would obscure the invention and are already well understood by those of ordinary skill in the art.

The advantages and uses of the present invention may be understood by examining simplified cross-sectional representations of the color filter and protective layer. FIG. 1 and FIG. 2 illustrates a simplified cross-sectional view of the color filter and protective layer or coating at various stages in processing. FIG. 1 shows a simplified cross-sectional representation of a filter and protective layer when using the protective layer to reduce bleeding of pigment between adjacent filters. The embodiment shown in FIG. 1 also minimize the probability of having to "rework" previously created filters when a misprocessing step occurs.

FIG. 1A illustrates a CFA polymer 104 which forms the color filter deposited over a substrate 108. Typically the substrate 108 may be a silicon wafer. A light sensor such as a photo-detector device may be formed underneath the CFA polymer 104. The photo-detector may be formed between the substrate 108 and CFA polymer 104 or the photo-detector may be embedded into the substrate 108. The CFA polymer 104 is preferably deposited in a spin coating process. CFA polymer 104 typically includes a base polymer resin such as a polyacrylate containing single strands of polymer. A solvent typically puts the resin in a solution form and a photo sensitizer is used to cause cross linking of the polymer strands. Organic metallic pigments are mixed with the resin. The type of pigment added determines the wavelengths of light filtered by the CFA polymer.

FIG. 1B illustrates the formation of a silation layer 112 over the CFA polymer 104. In a preferred embodiment, a hexamethyl di-silizane (HMDS) silation process is used to form the silation layer 112. The silation layer may be made up of a silicon oxide. In the preferred embodiment, the silation layer 112 is only two to three angstroms thick and is transparent to light.

In order to form adjacent color filters, a second or subsequent layer of CFA polymer 116 is deposited over substrate 108 in a "subsequent" deposition process. The subsequent layer of CFA polymer 116 may surround the silation layer 112 as illustrated in FIG. 1C. The subsequent layer of CFA polymer 116 contains different organo-metallic pigments than the initial CFA polymer 104. A photo definition process removes excess CFA polymer material in the subsequent layer resulting in a second filter 120 in close proximity to the first filter formed by CFA polymer 104 as illustrated in FIG. 1D. The second filter 120 and the first filter have different light transmission characteristics because of the different organo-metallic pigment incorporated into the polymer. The silation layer 112 surrounding the first filter minimizes bleeding or intermixing of material between the second filter 120 and the first filter.

In the event of misprocessing, silation layer 112 allows removal of the second filter 120 without damaging the first filter formed by CFA polymer 104. When a misprocessing step occurs during the formation of the second filter 120, the second filter 120 is removed leaving the first filter with its protective silation layer 112 intact as illustrated in FIG. 1E. In a typical set of photodetectors, second and third color filters are also fabricated around the original filter.

FIG. 2 illustrates a simplified cross-section of a filter array structure including silation layers appropriate for scratch protection during package assembly. FIG. 2A illustrates a CFA polymer or first filter 204 formed over a photo-detector and a substrate 208. Exposing the first filter 204 to a Hexomethyl di-silizane (HMDS) gas results in the formation of a silation layer 212 over first filter 204 as illustrated in FIG. 2B.

In FIG. 2C, a subsequent CFA polymer layer 216 is deposited over the first filter 204 and silation layer 212. A photo definition process is performed to remove excess material resulting in a second filter 220 on top of the first filter 204 and silation layer 212. The first silation layer 212 prevents bleeding of pigment between the first filter 204 and the second filter 220. First silation layer 212 also protects the first filter 204 from damage in the event of processing errors during fabrication of the second filter 220. To form a second silation layer 224 over the second filter 220 as illustrated in FIG. 2E, the second filter 220 is exposed to a HMDS gas. After exposure to the HMDS gas, both the first color filter 204 and the second color filter 220 are protected by corresponding silation layers 212 and 224. Each silation layer 212 and 224 is typically a few angstroms thick and minimizes the chance of damage to the formed color filters 204, 220 during taping and subsequential detaping of the filter surface.

FIG. 3 illustrates a cross-section of a device using the formed color filters. Oxide layer 304 acts as a substrate supporting the detection apparatus. A light sensing device such as a semiconductor photo-detector is typically incorporated into the oxide or fabricated in a layer on the surface of the oxide 304. In the illustrated embodiment of FIG. 3, a silicon nitride layer 308 is grown on top of the oxide 304. A color filter 312 is formed in a well between metal lines 324, 328. A silicon nitride layer surrounds metal lines 324, 328. The color filter 312 is typically made of a polymer with a pigmented acrylate filled in. The filter allows light of a predetermined frequency range to pass through. The color filter 312 blocks out other colors of light. A protective silane layer 320 covers the color filter layer 312. It should be noted that the illustration shown is not to scale because the silane layer 320 is typically only two to three angstroms thick while the color filter 312 is typically a height of approximately 15,000 angstroms. Thus in a scaled drawing, the silane layer 320 would barely be visible.

Silane layer 320 serves as a protective coating and is preferably optically transparent. Thus silane layer 320 preferably does not affect the light transitivity of the color filter 312. Metal lines 324, 328 are typically composed of aluminum-silicon-copper alloy and in the illustrated embodiment are surrounded by silicon nitride material. In one embodiment of the invention the metal lines 324, 328 are used as contacts for connection to photo-detectors under the filter 312.

In a preferred embodiment of the invention, three different color filters 312 corresponding to three photodetectors will be used to generate a color image. Each photodetector will detect light in a corresponding frequency range. The three filters and detectors (forming a set) are coupled to processing electronics (not shown) which determine the approximate intensity of light in each frequency range in the general vicinity of the three photodetectors. In one embodiment, the processing electronics may be part of a graphics card in a personal computer. The information is interpolated by the electronics to determine the color and intensity of light striking the particular region or pixel.

Figure 4B:
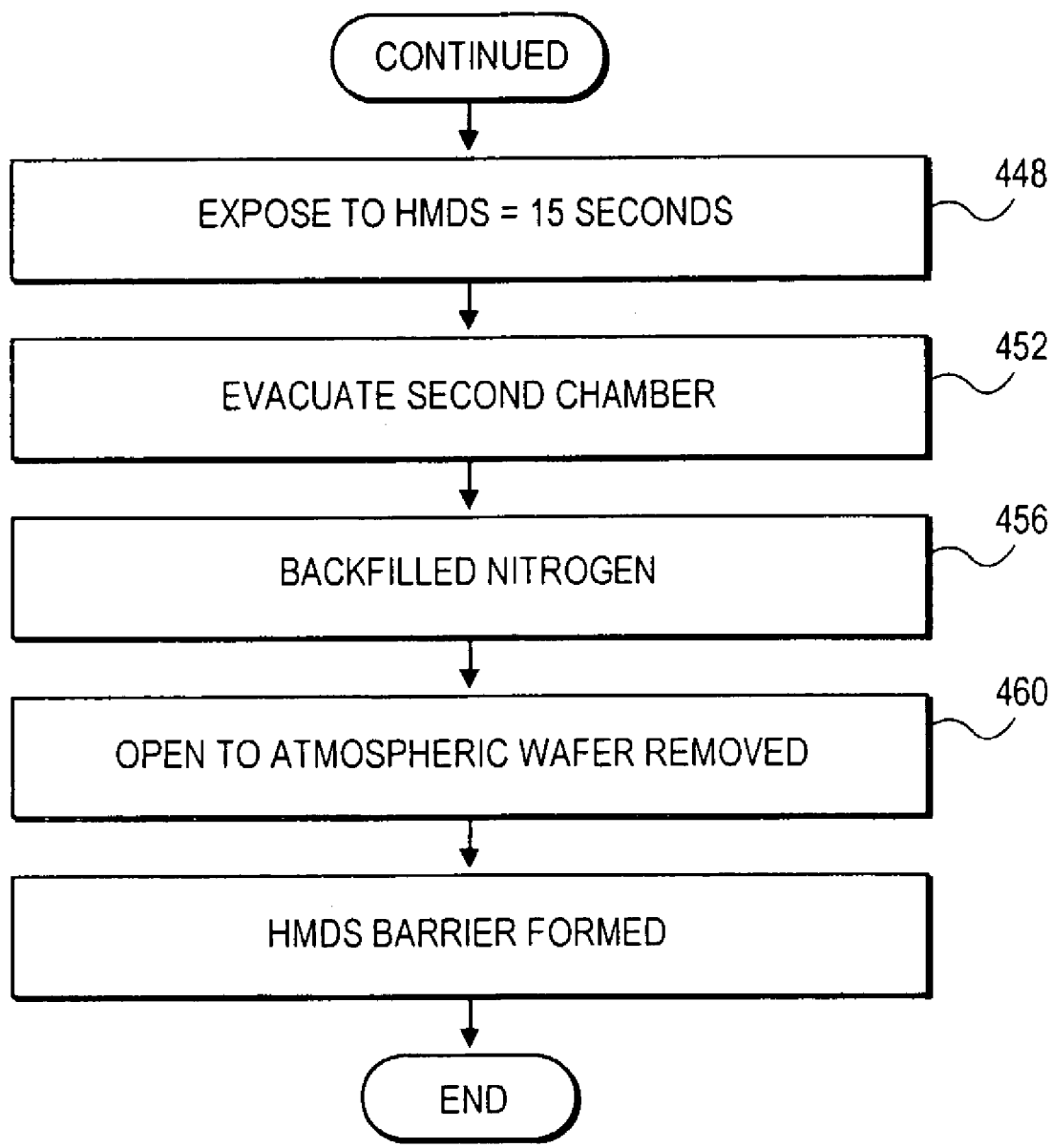

FIG. 4 is a flow diagram illustrating the steps used in fabricating color filters and protective layers around color filters for use in light detecting devices. In step 404, a photo diode designed to detect light is formed on a substrate. Other non-organic structures such as metal lines may also be formed. The substrate typically includes a silicon oxide material. One example of a suitable substrate is a semiconductor wafer used in semiconductor processing. In step 408, a polymer coating for forming a filter is deposited on the substrate, preferably in a spin coating process. The polymer coating is typically a resin impregnated with an organic metallic pigment to determine the light transmissively characteristics of the polymer. In step 412, the material is baked at approximately 90° Celsius for approximately 90 seconds to cure the polymer coat.

To form device structures, a mask is placed over the polymer coating and the entire surface is exposed to light of approximately 365 nanometers wavelength for approximately 200 milliseconds in step 416. The resulting material is developed in a developer solution to remove excess material in step 420. In one embodiment, the developer is a dilute ammonium hydroxide alkaline in photo resist solution. The resulting structure is baked again in step 424 at approximately 1800 centigrade for three minutes to cure the material. The formation of a first filter for filtering one color of light is thus completed.

In steps 428-460, a silane protective layer is formed over the color filter. The filter and accompanying substrate is placed in a second chamber and heated to approximately 130° centigrade in step 428. The second chamber is evacuated of gases in step 432 to create an approximate vacuum. In step 436, the chamber is back-filled with nitrogen or another inert gas. In step 440, the chamber is evacuated to a sub-atmospheric pressure. Hexomethyl di-silizane (HMDS) in liquid form is introduced into the second chamber in step 444. Although HMDS is in a liquid form outside of the chamber, the sub-atmospheric pressure results in the formation of a HMDS vapor within the chamber. The polymer filter material is exposed to the HMDS vapor for approximately 15 seconds in step 448 resulting in the formation of a silation layer. The second chamber is evacuated in step 452 and again backfilled with nitrogen in step 456 to approximately atmospheric pressure. The completed filter with silation layer is removed in step 460.

When prevention of bleeding between different colored filters is desired, the steps described in steps 408 through 460 must be repeated for each different color of filter implemented to form a silation layer around each filter type. For example, a red, green, blue filter scheme would require three repetitions of steps 408 through 460, each repetition modifying step 408 to introduce a polymer material containing a different mix of pigment. The different pigments result in different light transmission characteristics.

When the purpose of the silation layer is merely to avoid damage during a detaping process, steps 408 through 460 need only be repeated once to cover all organic surfaces with a silane layer for the taping/detaping process. Performing step 408 through 452 once after all filters have been formed results in one silation layer over all of the filters (the HMDS automatically bonds to exposed polymer layers). A tape could then be applied to the entire surface to protect the surface while grinding other surfaces of the wafer and applying gold contacts. After completion of the grinding and gold contact application procedure, the tape, typically a cellophane tape, could be removed. The silation layer reduces the probability of damage to the underlying color filters during the de-tape process.

Once completed, each filter typically allows only predetermined wavelengths or colors of light to reach the photo diode. Using sets of several photo diodes in close proximity, each photo diode having a different color filter allows a processor to determine the color and intensity of light striking a small region. By using multiple sets of photo diodes in an array structure, a color image can be reconstructed.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed:

1. A method of fabricating a light detecting structure comprising:
   fabricating a first color filter over a first photodetector on a substrate to form a first filter-detector combination;
   placing the substrate including the first filter-detector combination in a chamber and exposing the first filter-detector combination to a silane compound in vapor form to form a first transparent protective layer being a silane coating over the first filter-detector combination; and then
   fabricating a second color filter over a second photodetector adjacent to the first photodetector on the substrate to form a second filter-detector combination, said second color filter designed to absorb light of a different wavelength than said first color filter; and then
   exposing the second color filter to a silane compound in vapor form to form a second transparent protective layer being a silane coating wherein the first and second protective layers prevent bleeding of material between the first and second filters; and
   removing the coated first and second filter-detector combinations from the chamber, wherein each of the first and second protective layers is 2-3 Angstroms thick.

2. The method of claim 1 wherein the silane compounds in vapor form are each hexomethyl di-silizane in vapor form.

3. The method of claim 1 further comprising:
   applying a tape over the silane coating of the second transparent protective layer; and then
   grinding a surface of the light detecting structure; and then
   removing the tape from the silane coating.

4. The method of claim 1 further comprising:
exposing the first color filter to a developer solution to remove excess material before exposing the first filter detector combination to the silane compound.

5. The method of claim 1 further comprising, prior to exposing the first filter detector combination to the silane compound:
heating the substrate in the chamber to approximately 130 degrees centigrade, and then evacuating the chamber, and then backfilling the chamber with an inert gas, and then evacuating the chamber to a sub-atmospheric pressure.

6. The method of claim 5 wherein the first filter-detector combination is exposed to the silane compound by, after having evacuated the chamber to the sub-atmospheric pressure, introducing liquid hexamethyl di-silizane (HMDS) into the chamber.

7. The method of claim 6 wherein the first filter-detector combination is exposed to said HMDS for about fifteen seconds to form the silane coating.

8. The method of claim 7 further comprising, after having exposed the first filter detector combination to said HMDS and prior to removing the coated first and second filter-detector combinations from the chamber, evacuating the chamber and then backfilling the chamber with an inert gas.

9. A method of fabricating a light detecting structure comprising:
fabricating a first color filter over a first photodetector on a substrate to form a first filter-detector combination;
placing the substrate including the first filter-detector combination in a chamber and exposing the first filter-detector combination to a silane compound in vapor form to form a first transparent protective layer being a silane coating over the first filter-detector combination;
fabricating a second color filter from a color filter layer that was created over the first color filter to form a second filter-detector combination, the second color filter to absorb a different wavelength of light than the first filter; and then
reworking said second color filter; and then
exposing the reworked second color filter to a silane compound in vapor form to form a second transparent protective layer being a silane coating over the second filter-detector combination; and
removing the coated first and second filter-detector combinations from the chamber wherein each of the first and second protective layers 2-3 Angstroms thick.

10. The method of claim 9 wherein the silane compounds in vapor form are each hexamethyl di-silizane in vapor form.

11. The method of claim 9 further comprising:
applying a tape over the silane coating of the second transparent protective layer; and then
grinding a surface of the light detecting structure; and then
removing the tape from the silane coating.

12. The method of claim 9 further comprising:
exposing the first color filter to a developer solution to remove excess material before exposing the first filter-detector combination to the silane compound.

13. The method of claim 9 further comprising, prior to exposing the first filter-detector combination to the silane compound:
heating the substrate in the chamber to approximately 130 degrees centigrade, and then evacuating the chamber, and then backfilling the chamber with an inert gas, and then evacuating the chamber to a sub-atmospheric pressure.

14. The method of claim 13 wherein the first filter-detector combination is exposed to the silane compound by, after having evacuated the chamber to the sub-atmospheric pressure, introducing liquid hexamethyl di-silizane (HMDS) into the chamber.

15. The method of claim 14 wherein the first filter-detector combination is exposed to said HMDS for about fifteen seconds to form the silane coating.

16. The method of claim 15 further comprising, after having exposed the first filter-detector combination to said HMDS and prior to removing the coated first and second combinations from the chamber, evacuating the chamber and then backfilling the chamber with an inert gas.

* * * * *